(12) United States Patent
Harris et al.

(10) Patent No.: US 7,202,770 B2
(45) Date of Patent: Apr. 10, 2007

(54) VOLTAGE VARIABLE MATERIAL FOR DIRECT APPLICATION AND DEVICES EMPLOYING SAME

(75) Inventors: Edwin James Harris, Deerfield, IL (US); Scott Davidson, Woodstock, IL (US); David Perry, Village of Lakewood, IL (US); Steven J. Whitney, Lake Zurich, IL (US)

(73) Assignee: Littelfuse, Inc., Des Plaines, IL (US)

( * ) Notice: Subject to any disclaimer, the term of this patent is extended or adjusted under 35 U.S.C. 154(b) by 0 days.

(21) Appl. No.: 10/410,393

(22) Filed: Apr. 8, 2003

(65) Prior Publication Data
US 2003/0218851 A1 Nov. 27, 2003

Related U.S. Application Data

(60) Provisional application No. 60/370,975, filed on Apr. 8, 2002.

(51) Int. Cl.
*H01C 7/10* (2006.01)
(52) U.S. Cl. .................................. 338/21; 338/221
(58) Field of Classification Search .............. 338/20, 338/21, 13, 22 R, 221, 260; 361/56, 126, 361/127
See application file for complete search history.

(56) References Cited

U.S. PATENT DOCUMENTS

| | | | |
|---|---|---|---|
| 2,273,704 A | 2/1942 | Grisdale | |
| 2,796,505 A | 6/1957 | Bocciarelli | |
| 2,978,665 A | 4/1961 | Vernet et al. | |
| 3,243,753 A | 3/1966 | Kohler | |
| 3,351,882 A | 11/1967 | Kohler et al. | |
| 3,591,526 A | 7/1971 | Kawashima et al. | |
| 3,619,725 A | 11/1971 | Soden et al. | |
| 3,685,026 A | 8/1972 | Wakabayashi et al. | |
| 3,685,028 A | 8/1972 | Wakabayashi et al. | |
| 3,742,420 A | 6/1973 | Harden, Jr. | |
| 3,743,897 A | 7/1973 | Harden, Jr. | |

(Continued)

FOREIGN PATENT DOCUMENTS

CA 1254323 A1 5/1989

(Continued)

OTHER PUBLICATIONS

European Search Report, Apr. 22, 1999.

*Primary Examiner*—Tu Hoang
(74) *Attorney, Agent, or Firm*—Bell, Boyd & Lloyd LLP

(57) ABSTRACT

The present invention provides overvoltage circuit protection. Specifically, the present invention provides a voltage variable material ("VVM") that includes an insulative binder that is formulated to intrinsically adhere to conductive and nonconductive surfaces. The binder and thus the VVM is self-curable and may be applied to an application in the form of an ink, which dries in a final form for use. The binder eliminates the need to place the VVM in a separate device or for separate printed circuit board pads on which to electrically connect the VVM. The binder and thus the VVM can be directly applied to many different types of substrates, such as a rigid (FR-4) laminate, a polyimide or a polymer. The VVM can also be directly applied to different types of substrates that are placed inside a device.

26 Claims, 7 Drawing Sheets

U.S. PATENT DOCUMENTS

| | | |
|---|---|---|
| 3,772,774 A | 11/1973 | Knippenberg et al. |
| 3,823,217 A | 7/1974 | Kampe |
| 3,858,144 A | 12/1974 | Bedard et al. |
| 3,913,219 A | 10/1975 | Lichtblau |
| 3,940,740 A * | 2/1976 | Coontz .................. 340/166 |
| 3,972,765 A | 8/1976 | Kondo et al. |
| 4,045,712 A | 8/1977 | DeTommasi |
| 4,124,747 A | 11/1978 | Murer et al. |
| 4,164,725 A | 8/1979 | Wiebe |
| 4,169,816 A | 10/1979 | Tsien |
| 4,177,376 A | 12/1979 | Horsma et al. |
| 4,177,446 A | 12/1979 | Diaz |
| 4,198,744 A | 4/1980 | Nicolay |
| 4,223,209 A | 9/1980 | Diaz |
| 4,252,692 A | 2/1981 | Taylor et al. |
| 4,259,657 A | 3/1981 | Ishikawa et al. |
| 4,272,471 A | 6/1981 | Walker |
| 4,278,706 A | 7/1981 | Barry |
| 4,304,987 A | 12/1981 | van Konynenburg |
| 4,318,220 A | 3/1982 | Diaz |
| 4,327,351 A | 4/1982 | Walker |
| 4,329,726 A | 5/1982 | Middleman et al. |
| 4,330,703 A | 5/1982 | Horsma et al. |
| 4,330,704 A | 5/1982 | Jensen |
| 4,331,948 A | 5/1982 | Malinaric et al. |
| 4,359,414 A | 11/1982 | Mastrangelo |
| 4,367,168 A | 1/1983 | Kelly |
| 4,383,942 A | 5/1983 | Davenport |
| 4,388,607 A | 6/1983 | Toy et al. |
| 4,426,546 A | 1/1984 | Hotta et al. |
| 4,503,415 A | 3/1985 | Rooney et al. |
| 4,514,718 A | 4/1985 | Birx |
| 4,533,896 A | 8/1985 | Belopolsky |
| 4,540,969 A | 9/1985 | Sugar |
| 4,547,830 A | 10/1985 | Yamauchi |
| 4,548,740 A | 10/1985 | von Tomkewitsch et al. |
| 4,554,732 A | 11/1985 | Sadlo et al. |
| 4,559,579 A | 12/1985 | Val |
| 4,612,529 A | 9/1986 | Gurevich et al. |
| 4,617,609 A | 10/1986 | Utner et al. |
| 4,626,818 A | 12/1986 | Hilgers |
| 4,652,848 A | 3/1987 | Hundrieser |
| 4,685,025 A | 8/1987 | Cartomagno |
| 4,689,475 A | 8/1987 | Kleiner et al. |
| 4,720,402 A | 1/1988 | Wojcik |
| 4,724,417 A | 2/1988 | Au et al. |
| 4,726,991 A | 2/1988 | Hyatt et al. |
| 4,749,623 A | 6/1988 | Endo et al. |
| 4,755,401 A | 7/1988 | Friedrich et al. |
| 4,771,260 A | 9/1988 | Gurevich |
| 4,774,024 A | 9/1988 | Deep et al. |
| 4,792,781 A | 12/1988 | Takahashi et al. |
| 4,800,253 A | 1/1989 | Kleiner et al. |
| 4,801,785 A | 1/1989 | Chan et al. |
| 4,813,891 A | 3/1989 | Walters et al. |
| 4,837,520 A | 6/1989 | Golke |
| 4,857,880 A | 8/1989 | Au et al. |
| 4,869,930 A | 9/1989 | Clarke et al. |
| 4,873,506 A | 10/1989 | Gurevich |
| 4,878,038 A | 10/1989 | Tsai |
| 4,882,466 A | 11/1989 | Friel |
| 4,884,163 A | 11/1989 | Deep et al. |
| 4,907,340 A | 3/1990 | Fang et al. |
| 4,910,389 A | 3/1990 | Sherman et al. |
| 4,924,074 A | 5/1990 | Fang et al. |
| 4,928,199 A | 5/1990 | Diaz et al. |
| 4,971,726 A | 11/1990 | Maeno et al. |
| 4,975,551 A | 12/1990 | Syvertson |
| 4,977,357 A | 12/1990 | Shrier |
| 4,980,541 A | 12/1990 | Shafe et al. |
| 4,992,333 A | 2/1991 | Hyatt |
| 5,002,637 A | 3/1991 | Toyoshima et al. |
| 5,068,061 A | 11/1991 | Knobel et al. |
| 5,068,634 A | 11/1991 | Shrier |
| 5,084,691 A | 1/1992 | Lester et al. |
| 5,089,929 A | 2/1992 | Hilland |
| 5,095,297 A | 3/1992 | Perreault et al. |
| 5,097,246 A | 3/1992 | Cook et al. |
| 5,097,247 A | 3/1992 | Doerrwaechter |
| 5,099,380 A | 3/1992 | Childers et al. |
| 5,102,506 A | 4/1992 | Tanielian et al. |
| 5,102,712 A | 4/1992 | Peirce et al. |
| 5,106,538 A | 4/1992 | Barma et al. |
| 5,106,540 A | 4/1992 | Barma et al. |
| 5,115,220 A | 5/1992 | Suuronen et al. |
| 5,119,218 A * | 6/1992 | Yoshimoto et al. .......... 349/41 |
| 5,136,365 A | 8/1992 | Pennisi et al. |
| 5,140,295 A | 8/1992 | Vermot-gaud et al. |
| 5,142,263 A | 8/1992 | Childers et al. |
| 5,148,141 A | 9/1992 | Suuronen |
| 5,155,462 A | 10/1992 | Morrill, Jr. |
| 5,166,656 A | 11/1992 | Badihi et al. |
| 5,173,359 A | 12/1992 | Toyoshima et al. |
| 5,183,698 A | 2/1993 | Stephenson et al. |
| 5,189,092 A | 2/1993 | Koslow |
| 5,189,387 A | 2/1993 | Childers et al. |
| 5,213,517 A | 5/1993 | Kerek et al. |
| 5,214,091 A | 5/1993 | Tanaka et al. |
| 5,232,758 A | 8/1993 | Juskey et al. |
| 5,246,388 A | 9/1993 | Collins et al. |
| 5,247,277 A | 9/1993 | Fang et al. |
| 5,248,517 A | 9/1993 | Shrier et al. |
| 5,250,226 A | 10/1993 | Oswai et al. |
| 5,250,228 A | 10/1993 | Baigrie et al. |
| 5,250,848 A | 10/1993 | Christie et al. |
| 5,260,848 A | 11/1993 | Childers |
| 5,262,754 A | 11/1993 | Collins |
| 5,267,003 A | 11/1993 | Grappiolo |
| 5,268,665 A | 12/1993 | Iwao |
| 5,273,815 A | 12/1993 | Brydon et al. |
| 5,278,535 A | 1/1994 | Xu et al. |
| 5,290,821 A | 3/1994 | Sakurai et al. |
| 5,294,374 A | 3/1994 | Martinez et al. |
| 5,303,523 A | 4/1994 | Hand et al. |
| 5,335,137 A | 8/1994 | English et al. |
| 5,340,641 A | 8/1994 | Xu |
| 5,340,775 A | 8/1994 | Carruthers et al. |
| 5,351,026 A | 9/1994 | Kanbara et al. |
| 5,363,082 A | 11/1994 | Gurevich |
| 5,374,590 A | 12/1994 | Batdorf et al. |
| 5,382,384 A | 1/1995 | Baigrie et al. |
| 5,384,190 A | 1/1995 | Kaburaki |
| 5,393,597 A | 2/1995 | Childers et al. |
| 5,399,295 A | 3/1995 | Gamble et al. |
| 5,407,872 A | 4/1995 | Komori et al. |
| 5,412,865 A | 5/1995 | Takaoka et al. |
| 5,416,662 A | 5/1995 | Kurasawa et al. |
| 5,438,166 A | 8/1995 | Carey et al. |
| 5,476,714 A | 12/1995 | Hyatt |
| 5,483,166 A | 1/1996 | Olsen |
| 5,483,407 A | 1/1996 | Anastasio et al. |
| 5,508,224 A | 4/1996 | Jang |
| 5,510,947 A | 4/1996 | Pellegrini et al. |
| 5,537,108 A | 7/1996 | Nathan et al. |
| 5,543,705 A | 8/1996 | Uezono et al. |
| 5,545,910 A | 8/1996 | Jang |
| 5,592,016 A | 1/1997 | Go et al. |
| 5,610,436 A | 3/1997 | Sponaugle et al. |
| 5,646,434 A | 7/1997 | Chrysostomides et al. |
| 5,669,381 A | 9/1997 | Hyatt |
| 5,707,886 A | 1/1998 | Consiglio et al. |
| 5,747,147 A | 5/1998 | Wartenberg et al. |
| 5,756,007 A | 5/1998 | Franey |
| 5,770,216 A * | 6/1998 | Mitchnick et al. .......... 428/402 |

| | | | | | | |
|---|---|---|---|---|---|---|
| 5,777,368 A | 7/1998 | Wu et al. | | EP | 0 169 059 A2 | 1/1986 |
| 5,781,395 A | 7/1998 | Hyatt | | EP | 0 229 286 A1 | 7/1987 |
| 5,796,570 A | 8/1998 | Medkharasarn et al. | | EP | 0 270 954 A1 | 6/1988 |
| 5,801,612 A | 9/1998 | Chandler et al. | | EP | 0 301 533 A2 | 7/1988 |
| 5,807,509 A | 9/1998 | Shrier et al. | | EP | 0 453 217 A1 | 4/1991 |
| 5,849,129 A | 12/1998 | Hogge et al. | | EP | 0 460 790 A1 | 12/1991 |
| 5,852,397 A | 12/1998 | Chan et al. | | EP | 0 581 428 A1 | 2/1994 |
| 5,864,281 A | 1/1999 | Zhang et al. | | EP | 0 588 136 A2 | 3/1994 |
| 5,874,885 A | 2/1999 | Chandler et al. | | EP | 0 625 808 A1 | 11/1994 |
| 5,889,308 A | 3/1999 | Hong et al. | | EP | 0 649 150 B1 | 4/1995 |
| 5,958,537 A | 9/1999 | Akhter | | EP | 0 827 160 A1 | 3/1998 |
| 5,973,588 A * | 10/1999 | Cowman et al. ............... 338/21 | | FR | 2523993 * | 9/1983 |
| 5,974,661 A | 11/1999 | Neuhalfen | | GB | 1172718 A | 12/1969 |
| 5,976,645 A | 11/1999 | Daluise et al. | | GB | 1449261 A | 9/1976 |
| 6,015,872 A | 1/2000 | Kawakita et al. | | JP | 05-33707 | 12/1972 |
| 6,023,028 A | 2/2000 | Neuhalfen | | JP | 53-104339 | 8/1978 |
| 6,064,094 A | 5/2000 | Intrater et al. | | JP | 53-126196 * | 11/1978 |
| 6,087,923 A | 7/2000 | Ahn et al. | | JP | 58-081264 | 5/1983 |
| 6,108,184 A | 8/2000 | Minervini et al. | | JP | 58-081265 | 5/1983 |
| 6,130,459 A | 10/2000 | Intrater | | JP | 58-162877 | 9/1983 |
| 6,153,831 A | 11/2000 | Weber et al. | | JP | 58-162878 | 9/1983 |
| 6,172,590 B1 | 1/2001 | Shrier et al. | | JP | 60-196901 | 10/1985 |
| 6,191,928 B1 | 2/2001 | Rector et al. | | JP | 62-279418 | 4/1987 |
| 6,211,554 B1 | 4/2001 | Whitney | | JP | 62-279419 | 4/1987 |
| 6,239,687 B1 | 5/2001 | Shrier et al. | | JP | 62-181347 | 8/1987 |
| 6,242,078 B1 | 6/2001 | Pommer et al. | | JP | 63-043701 | 2/1988 |
| 6,251,513 B1 | 6/2001 | Rector et al. | | JP | 63-085864 | 4/1988 |
| 6,263,937 B1 | 7/2001 | Barnes | | JP | 01-104334 | 4/1989 |
| 6,310,752 B1 | 10/2001 | Shrier et al. | | JP | 02-109226 | 4/1990 |
| 6,351,011 B1 | 2/2002 | Whitney et al. | | JP | 03-221613 | 9/1991 |
| 6,357,890 B1 | 3/2002 | Parsons et al. | | JP | 03-271330 | 12/1991 |
| 6,373,719 B1 | 4/2002 | Behling et al. | | JP | 04-033230 | 2/1992 |
| 6,433,394 B1 | 8/2002 | Intrater | | JP | 4242036 | 8/1992 |
| 6,445,280 B1 * | 9/2002 | Javadi ........................ 338/214 | | JP | 04-245129 | 9/1992 |
| 6,522,515 B1 | 2/2003 | Whitney | | JP | 04-245132 | 9/1992 |
| 6,531,339 B2 * | 3/2003 | King et al. .................. 438/110 | | JP | 04-255627 | 9/1992 |
| 6,542,065 B2 * | 4/2003 | Shrier et al. ................... 338/21 | | JP | 05-166454 | 7/1993 |
| 6,547,597 B2 | 4/2003 | Harris, IV | | JP | 52-62680 | 10/1993 |
| 6,549,114 B2 | 4/2003 | Whitney et al. | | JP | 05-314888 | 11/1993 |
| 6,570,765 B2 | 5/2003 | Behling et al. | | JP | 06-103880 | 4/1994 |
| 6,628,498 B2 | 9/2003 | Whitney et al. | | JP | 06-298148 | 10/1994 |
| 6,642,297 B1 | 11/2003 | Hyatt et al. | | JP | 07-161503 | 6/1995 |
| 6,657,532 B1 | 12/2003 | Shrier et al. | | JP | 02-199302 | 7/1997 |
| 6,693,508 B2 * | 2/2004 | Whitney et al. ............... 338/20 | | JP | 2000-200869 | 7/2000 |
| 6,935,879 B2 | 8/2005 | Whitney et al. | | JP | 04-248221 | 9/2002 |
| 7,034,652 B2 | 4/2006 | Whitney et al. | | WO | WO 83/01153 | 3/1983 |
| 7,035,072 B2 | 4/2006 | Colby | | WO | WO 90/00305 | 11/1990 |
| 2002/0050912 A1 * | 5/2002 | Shrier et al. ................... 338/21 | | WO | WO 93/14511 | 7/1993 |
| 2003/0011026 A1 * | 1/2003 | Colby ........................ 257/322 | | WO | WO 94/01876 | 1/1994 |
| 2003/0013324 A1 * | 1/2003 | Whitney et al. ............... 439/59 | | WO | WO 94/25966 | 11/1994 |
| 2003/0025587 A1 * | 2/2003 | Whitney et al. ........... 338/22 R | | WO | WO 95/33276 | 12/1995 |
| 2003/0211406 A1 * | 11/2003 | Keusseyan ................... 430/14 | | WO | WO 95/33278 | 12/1995 |
| 2004/0201941 A1 * | 10/2004 | Harris et al. ................. 361/127 | | WO | WO 95/34084 | 12/1995 |
| 2005/0057867 A1 * | 3/2005 | Harris et al. ................... 361/56 | | WO | WO 96/41355 | 12/1996 |
| | | | | WO | WO 97/21230 | 6/1997 |
| | FOREIGN PATENT DOCUMENTS | | | WO | WO 98/34084 | 8/1998 |
| CH | | 663 491 A5 | 12/1987 | WO | WO 99/24992 | 5/1999 |
| DE | | 1803554 A1 | 5/1969 | | | |
| DE | | 3728489 A1 | 8/1987 | * cited by examiner | | |

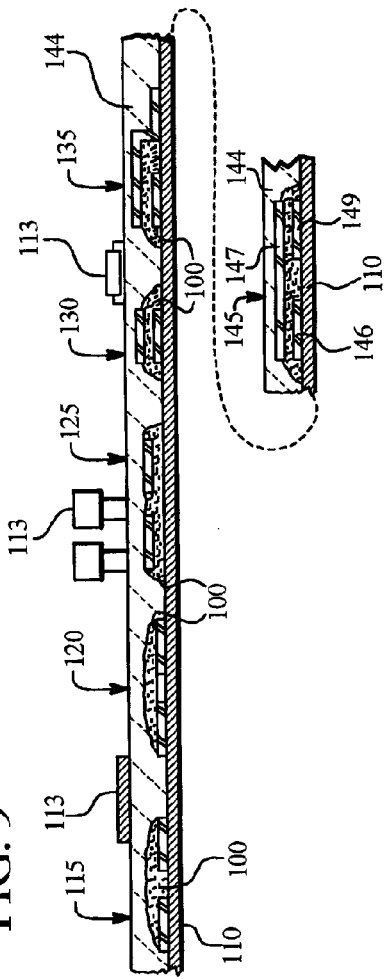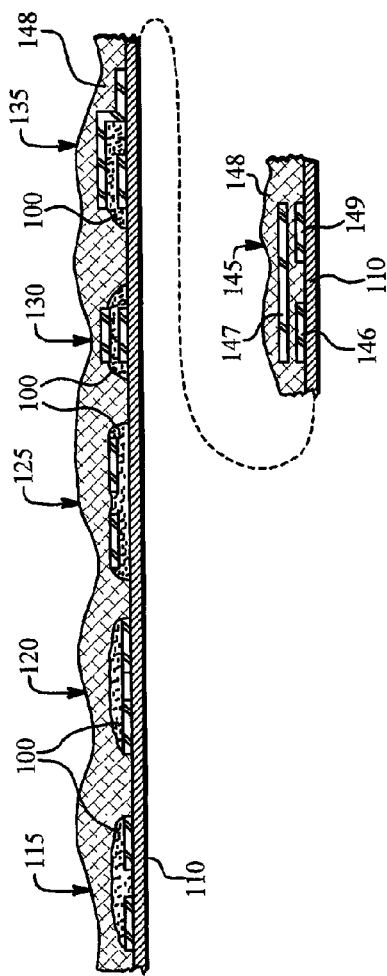

VOLTAGE VARIABLE MATERIAL FOR DIRECT APPLICATION AND DEVICES EMPLOYING SAME

PRIORITY CLAIM

This application claims the benefit of U.S. Provisional Patent Application No. 60/370,975, filed Apr. 8, 2002, entitled "Voltage Variable Material For Direct Application And Devices Employing Same", the entire contents of which are hereby incorporated by reference and relied upon.

CROSS-REFERENCE TO RELATED APPLICATIONS

This application is related to the following commonly-owned co-pending patent applications: "Polymer Composite Materials for Electrostatic Discharge Protection," Ser. No. 09/232,387, "Voltage Variable Substrate Material," Ser. No. 09/976,964.

BACKGROUND OF THE INVENTION

The present invention generally relates to circuit protection. More specifically, the present invention relates to voltage variable materials.

Electrical overstress ("EOS") transients produce high electric fields and usually high peak power that can render circuits or the highly sensitive electrical components in the circuits, temporarily or permanently non-functional. EOS transients can include transient voltages capable of interrupting circuit operation or destroying the circuit outright. EOS transients may arise, for example, from an electromagnetic pulse, an electrostatic discharge, lightning, a build-up of static electricity or be induced by the operation of other electronic or electrical components. An EOS transient can rise to its maximum amplitude in subnanosecond to microsecond times and have repeating amplitude peaks.

Materials exist for the protection against EOS transients, which are designed to respond very rapidly (ideally before the transient wave reaches its peak) to reduce the transmitted voltage to a much lower value for the duration of the EOS transient. EOS materials are characterized by high electrical resistance values at low or normal operating voltages. In response to an EOS transient, the materials switch very rapidly to a low electrical resistance state. When the EOS dissipates, these materials return to their high resistance state. EOS materials also recover very rapidly to their original high resistance value upon dissipation of the EOS transient.

EOS materials are capable of repeated switching between the high and low resistance states. EOS materials can withstand thousands of ESD events and recover to desired off-status after providing protection from each of the individual ESD events.

Circuits employing EOS materials can shunt a portion of the excessive voltage or current due to the EOS transient to ground, protecting the electrical circuit and its components. Another portion of the threat transient reflects back towards the source of the threat. The reflected wave is either attenuated by the source, radiated away, or redirected back to the surge protection device, which responds in kind to each return pulse until the threat energy is reduced to safe levels. A typical circuit employing an EOS transient device is illustrated in FIG. 1.

With reference to FIG. 1, a typical electrical circuit 10 is illustrated. The circuit load 12 in the circuit 10 operates at a normal operating voltage. An EOS transient of substantially more than two to three times the normal operating voltage having a sufficient duration can damage the load 12 and the components contained therein. Typically, EOS threats can exceed the normal operating voltage by tens, hundreds or even thousands of times the voltages seen in normal operation.

In the circuit 10, an EOS transient voltage 14 is shown entering the circuit 10 along line 16. Upon the occurrence of the EOS transient voltage 14, an EOS protection device 18 switches from the high resistance state to a low resistance state thus clamping the EOS transient voltage 14 at a safe, low value. The EOS protection device 18 shunts a portion of the transient threat from the electronic line 16 to the system ground 20. As stated above, the EOS protection device 18 reflects a large portion of the threat back towards the source of the threat.

EOS protection devices typically employ a voltage variable material ("VVM"). Many VVM's have been of a consistency and make-up that they have required some type of housing or encapsulation. That is, the VVM materials have heretofore been provided in a device, such as a surface mount device, mounted to a printed circuit board ("PCB"). The VVM devices typically have been mounted discretely from the devices of the circuit that require protection. This presents a variety of problems.

First, VVM devices add to the number of components that are required to be mounted to the PCB. The VVM devices consume valuable board space and add to the potential for defects. The VVM devices typically require that additional pads be secured to the PCB and that additional circuit traces be routed from PCB devices or from a ground plane to the VVM pads. It is always desirable for cost, spacing/flexibility and reliability purposes, to reduce the number of components mounted to a PCB.

Second, adding components to an existing PCB can require a board redesign or other type of incorporation into a currently pending design. If the application is already in production, it is likely that a considerable amount of time has been spent optimizing board space, which may or may not leave room to integrate a VVM device.

Third, many EOS transients occur outside of the PCB and are transmitted to the PCB through cables and wires. For instance, networked computer and telephone systems are subject to a variety of transients caused by environmental and handling activities. In these situations, it would be desirable to eliminate voltage transients before they reach the PCB.

SUMMARY OF THE INVENTION

The present invention provides overvoltage circuit protection. Specifically, the present invention provides a voltage variable material ("VVM") that includes an insulative binder that is formulated to intrinsically adhere to conductive and nonconductive surfaces. The binder and thus the VVM is self-curable and may be applied to an application in the form of an ink, which dries in a final form for use. The binder eliminates the need to place the VVM in a separate device and for separate printed circuit board pads on which to electrically connect the VVM. The binder and thus the VVM can be directly applied to many different types of substrates, such as a rigid (FR-4) laminate, a polyimide, a polymer, glass and ceramic. The VVM can also be directly applied to different types of substrates that are placed inside a piece of electrical equipment (e.g., a connector).

The binder of the VVM includes a polymer, such as polyester, which is dissolved in a solvent. One suitable solvent for dissolving the polymer is diethylene glycol monoethyl ether acetate, commonly referred to as "carbitol acetatate". In an embodiment, a thickening agent, such as a fumed silica, is added to the insulative binder, which increases the viscosity of the insulative binder. A number of different types of particles are then mixed in the binder to produce a desired clamping voltage and response time. The different types of particles include: conductive particles, insulating particles, semiconductive particles, doped semiconductive particles and any combination thereof.

The conductive particles in an embodiment include an inner core and an outer shell. The core and the shell have different conductivities or resistivities. Either the shell is more conductive than the core or the core is more conductive than the shell. The core and shell can each individually consist of any of the different types of particles listed above. In one preferred embodiment, the conductive particles include an aluminum core and an aluminum oxide shell.

The VVM having the binder of the present invention can be applied to a substrate to form various circuits or applications. In a first application, a plurality of electrodes or conductors secure to a printed circuit board via any known technique. The electrodes are each separated on the printed circuit board by a gap. The VVM is applied to and intrinsically adheres to the electrodes and the substrate in the gap. In a second application, the electrodes are again secured to the substrate, but the VVM only intrinsically adheres to the electrodes. That is, the VVM does not adhere to the substrate but is placed across the gap.

In a third application, the VVM intrinsically adheres to a substrate, wherein the electrodes are placed on and intrinsically adhere to the VVM. That is, the VVM secures the electrodes to the substrate. In a forth application, at least one of a plurality of electrodes is secured to the substrate, wherein the VVM intrinsically adheres to the secured electrode. At least one other electrode resides on top of the VVM. The gap between the electrodes is formed by the thickness of the VVM. Here, the VVM may or may not additionally, intrinsically secure to the substrate. The electrode that resides on top of the VVM can also have a portion that secures to the substrate.

When the VVM is applied to a circuit, such as on a printed circuit board, the quantity of VVM self-cures in a finished form that does not require a separate protective covering. The VVM may be left open to the environment through manufacture, shipping and use. The substrate can be any type of substrate, such as a rigid laminate (e.g., FR-4) used with printed circuit boards, a material such as a polyimide used with flexible circuits (e.g., Kapton® material), a polymer, ceramic or glass as well as any combination of these.

In another embodiment, the substrate can be coated or otherwise protected. For example, any of the applications described above can be covered with a coating. The coating can be any one of a variety of different materials including: a dry film photo-imagable coverlay, a spray liquid photo-imagable coverlay or a "glob-top" type coating as it is known in the art. Alternatively, any of the applications described above can be embedded in a multilayered printed circuit board ("PCB"). In another embodiment, at least one additional electrode or conductor secures to an underside of an upper substrate, wherein the VVM exists between the upper and lower substrates and intrinsically adheres to at least the upper and lower electrodes and possibly to one or more of the upper and lower substrates.

The circuit may or may not be provided in a device. For example, the device in an embodiment is a telecommunications device, such as an RJ-45 or RJ-11 connector. In another embodiment, the device is an input/output connector, such as a Deutsches Institut für Normung eV ("DIN") connector or ribbon cable connector. In each of these devices, the VVM protects one or more signal lines from transient voltage spikes by connecting the signal conductors to a ground conductor or shield.

In one embodiment, an RJ type connector includes a plurality of signal conductors. The connector also includes a grounded conductive shield. The shield is cut or stamped to yield at least one tab that is biased downwards towards the conductors. In one embodiment, the shield defines a separate tab for each of the conductors. The connector includes a housing that compresses the tabs onto the conductors. VVM is applied between the shield tabs and the conductors to provide overvoltage protection to the RJ connector. In an embodiment, the VVM is the intrinsically securing VVM described above, however, a known VVM provided in a device could also be used. In another embodiment, a capacitor is placed between the VVM and one of the conductors and the shield tab to block high DC voltages, such as those imposed during high potential [HI-POT] testing.

It is therefore an advantage of the present invention to provide an intrinsically adhesive VVM.

Another advantage of the present invention is to provide a VVM that does not need to be housed in a separate device.

A further advantage of the present invention is to provide a VVM that is self-curing.

Yet another advantage of the present invention is to provide a VVM that adheres directly to a printed circuit board without the need for providing separate electrical pads on the substrate on which to mount the VVM.

Yet a further advantage of the present invention is to provide a VVM that adheres directly to a polymer or plastic.

Still another advantage of the present invention is to directly apply a VVM to a substrate, wherein the substrate is provided in an electrical device, such as a piece of equipment or a connector.

Still a further advantage of the present invention is to provide RJ type connectors having overvoltage protection.

Moreover, an advantage of the present invention is to provide input/output connectors having overvoltage protection.

Further still, an advantage of the present invention is to provide an apparatus for electrically connecting VVM (and alternatively additionally a capacitor) to a plurality of different signal lines in an RJ type connector.

Moreover, an advantage of the present invention is, via the elimination of the need for a housing, to provide a lower cost, readily produced circuit protection material that can result in improved electrical performance due to the reduction of parasitic impedance.

Additional features and advantages of the present invention will be described in, and apparent from, the following Detailed Description of the Preferred Embodiments and the Drawings.

BRIEF DESCRIPTION OF THE DRAWINGS

FIG. 9 is a sectioned elevation view illustrating the circuit arrangements of FIGS. 4 to 7 laminated in a multilayer PCB.

FIG. 10 is a sectioned elevation view illustrating the circuit arrangements of FIGS. 4 to 7 covered with a protective coating.

DETAILED DESCRIPTION OF THE INVENTION

Figure 1:
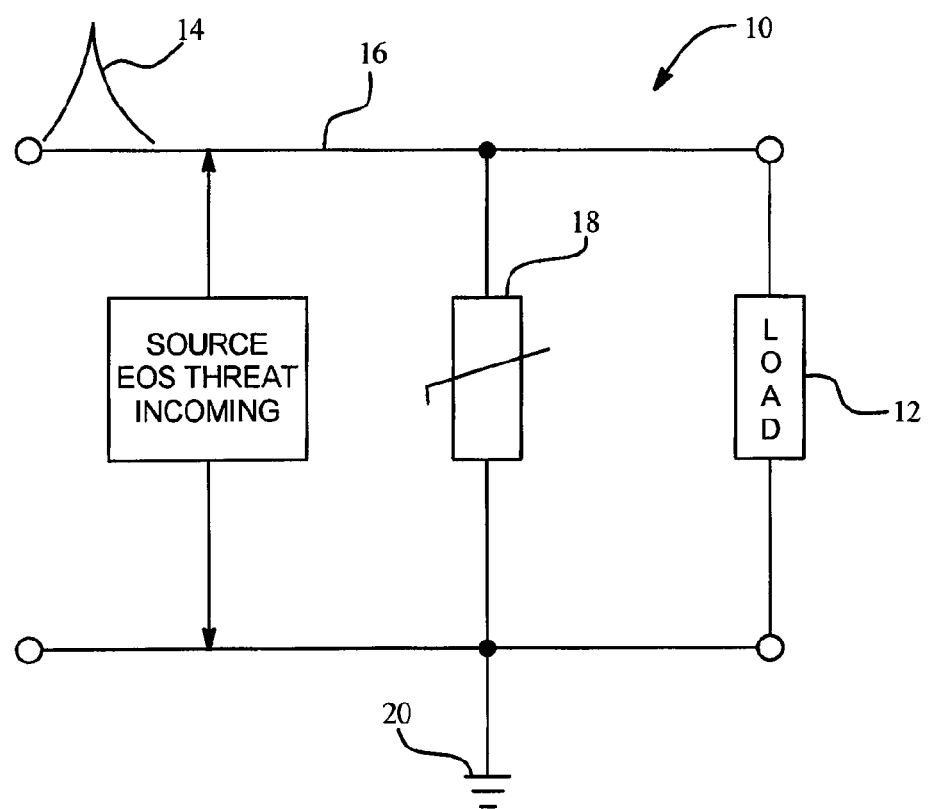
FIG. 1 is a schematic illustration of a typical waveform of an electrical overstress transient.
Figure 2:
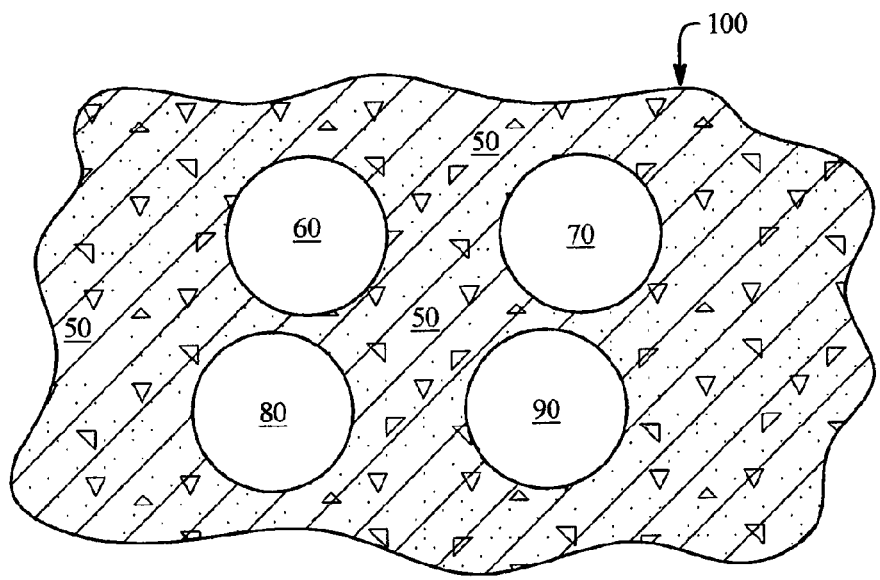
FIG. 2 is a schematic illustration of certain possible components for the voltage variable material ("VVM") of the present invention.

Referring now to FIG. 2, a voltage variable material ("VVM") 100 of the present invention includes an insulative binder 50. The binder 50 secures one or more or all of certain different types of particles, such as insulating particles 60, semiconductive particles 70, doped semiconductive particles 80, conductive particles 90 and various combinations of these. The insulative binder 50 has intrinsically adhesive properties and self-adheres to surfaces, such as a conductive, metal surface or a non-conductive, insulative surface. The insulative binder 50 has a property of being self-curing, so that the VVM 100 can be applied to a circuit or application and be used thereafter without heating or otherwise curing the VVM 100 and the insulative binder 50. It should be appreciated, however, that the circuit or application employing the VVM 100 with the binder 50 may be heated or cured to accelerate the curing process.

The insulative binder 50 of the VVM 100 in an embodiment includes a polymer or thermoplastic resin, such as polyester, which is dissolved in a solvent. In one embodiment, the polyester resin has a glass transition temperature in the range of 6° C. to 80° C. and a molecular weight between 15,000 and 23,000 atomic mass units ("AMU's"). One suitable solvent for dissolving the polymer is diethylene glycol monoethyl ether acetate, commonly referred to as "carbitol acetatate". In an embodiment, a thickening agent is added to the insulative binder 50, which increases the viscosity of the insulative binder 50. For example, the thickening agent can be a fumed silica, such as that found under the tradename Cab-o-Sil TS-720.

The insulative binder 50 in an embodiment has a high dielectric breakdown strength, a high electrical resistivity and high tracking resistance. The insulative binder 50 provides and maintains sufficient interparticle spacing between the other possible components of VVM 100, such as the conductive particles 90, the insulating particles 60, the semiconductive particles 70 and the doped semiconductive particles 80. The interparticle spacing provides a high resistance. The resistivity and dielectric strength of the insulative binder 50 also affects the high resistance state. In an embodiment, the insulative binder 50 has a volume resistivity of at least $10^9$ ohm-cm. It is possible to blend different polymers in the binder 50 and to cross-link same.

In an embodiment, insulating particles 60 are dispersed into the binder 50 of the VVM 100. The insulating particles 60 in an embodiment have an average particle size in a range of about 200 to about 1000 angstroms and a bulk conductivity of less than $10^{-6}$ $(ohm-cm)^{-1}$. In one embodiment, the insulating particles 60 have an average particle size in a range of about 50 Angstroms to about 200 Angstroms.

The fumed silica of the binder 50, such as that available under the tradename Cab-o-Sil TS-720, constitutes insulating particles 60. Other insulative particles 60, however, can be used in addition to the fumed silica. For example, glass spheres, calcium carbonate, calcium sulphate, barium sulphate, aluminum trihydrate, kaolin and kaolinite, ultra high-density polyethylene (UHDPE) and metal oxides such as titanium dioxide may also be used as insulating particles 60 in the present invention. For example, titanium dioxide having an average particle size from about 300 to 400 angstroms, manufactured by Nanophase Technologies, provides a suitable insulating particle 60.

The insulating particles 60 can also include oxides of iron, aluminum, zinc, titanium, copper and clay such as a montmorillonite type produced by Nanocor, Inc. Insulating particles 60 in addition to the fumed silica, if employed in the VVM 100, are present in an embodiment from about one to about fifteen percent by weight of the VVM 100.

In an embodiment, semiconductive particles 70 are dispersed into the binder 50 of the VVM 100. The semiconductive particles 70 in an embodiment include an average particle size of less than 5 microns and bulk conductivities in the range of 10 to $10^{-6}$ $(ohm-cm)^{-1}$. In order to maximize particle packing density and obtain optimum clamping voltages and switching characteristics, the average particle size of the semiconductive particles 70 in one preferred embodiment is in a range of about 3 to about 5 microns, or even less than 1 micron. Semiconductive particle sizes down to the 100 nanometer range and less are also suitable for use in the present invention.

The material of the semiconductive particles 70 in an embodiment includes silicon carbide. The semiconductive particle materials can also include: oxides of bismuth, copper, zinc, calcium, vanadium, iron, magnesium, calcium and titanium; carbides of silicon, aluminum, chromium, titanium, molybdenum, beryllium, boron, tungsten and vanadium; sulfides of cadmium, zinc, lead, molybdenum, and silver; nitrides such as boron nitride, silicon nitride and aluminum nitride; barium titanate and iron titanate; suicides of molybdenum and chromium; and borides of chromium, molybdenum, niobium and tungsten.

In an embodiment, the semiconductive particles 70 include silicon carbide for example, manufactured by Agsco, which can be of #1200 grit and have an average particle size of approximately 3 microns. The silicon carbide can alternatively be manufactured by Norton, be of #10,000 grit, and have an average particle size of approximately 0.3 microns. In another embodiment, the semiconductive particles 70 include silicon carbide and/or at least one other material including: barium titanate, boron nitride, boron phosphide, cadmium phophide, cadmium sulphide, gallium nitride, gallium phosphide, germanium, indium phosphide, magnesium oxide, silicon, zinc oxide, and zinc sulphide.

In an embodiment, doped semiconductive particles 80 are dispersed into the binder 50 of the VVM 100. The addition of certain impurities (dopants) affects the electrical conductivity of a semiconductor. The impurity or material used to dope the semiconductor material may be either an electron donor or an electron acceptor. In either case, the impurity occupies the energy level within the energy band gap of an otherwise pure semiconductor. By increasing or decreasing the impurity concentration in a doped semiconductor, the electrical conductivity of the material is varied. The electrical conductivity of a pure semicondcutor may be extended upward (into the range of a semimetal or metal) by increasing the conduction electron concentration, or may be extended downward (into the range of an insulator) by decreasing the conduction electron concentration.

In one embodiment, the semiconductive particles 70 and doped semiconductive particles 80 are mixed into the insulative binder 50 of the VVM 100 via standard mixing techniques. In another embodiment, various different doped semiconductive particles 80 that have been doped to different electrical conducitivities are dispersed into the insulative binder 50 of the VVM 100. Either of these embodiments can also include insulating particles 60.

In one embodiment, the VVM 100 employs a semiconductive particle doped with a material to render it electrically conductive. The doped semicondcutive particles 80 may be comprised of any conventional semiconductor material including: boron nitride, boron phosphide, cadmium phosphide, cadmium sulphide, gallium nitride, gallium phosphide, germanium, indium phosphide, silicon, silicon carbide, zinc oxide, zinc sulfide as well as electrically conducting polymers, such as polypyrole or polyaniline. These materials are doped with suitable electron donors for example, phosphorous, arsenic, or antimony or electron acceptors, such as iron, aluminum, boron, or gallium, to achieve a desired level of electrical conductivity.

In an embodiment, the doped semiconductive particles 80 include a silicon powder doped with aluminum (approximately 0.5% by weight of the doped semiconductive particle 80) to render it electrically conductive. Such a material is marketed by Atlantic Equipment Engineers under the tradename Si-100-F. In another embodiment, the doped semiconductive particles include an antimony doped tin oxide marketed under the tradename Zelec 3010-XC.

In an embodiment, the doped semiconductive particles 80 of the VVM 100 have an average particle size less than 10 microns. In order to maximize particle packing density and obtain optimum clamping voltages and switching characteristics, however, the average particle size of the semiconductive particles may be in a range of about 1 to about 5 microns, or even less than 1 micron.

Each of the insulating particles 60, semiconductive particles 70 and doped semiconductive particles 80 are optionally dispersed into the binder 50 of the VVM 100. The fumed silica, or Cab-o-Sil, of the binder 50 constitutes an insulating particle 60. In a preferred embodiment, the VVM 100 includes conductive particles 90. The conductive particles 90 in an embodiment have bulk conductivities of greater than 10 (ohm-cm)$^{-1}$ and especially greater than 100 (ohm-cm)$^{-1}$. It is possible, however, that by using doped semiconductive particles the VVM 100 does not include conductive particles 90.

The conductive particles 90 in an embodiment have a maximum average particle size less than 60 microns. In an embodiment, ninety-five percent of the conductive particles 90 have diameters no larger than 20 microns. In another embodiment, one hundred percent the conductive particles 90 are less than 10 microns in diameter. In a further embodiment, conductive particles 90 with average particle sizes in the submicron range, for example one micron down to nanometers, are used.

Suitable materials for the conductive particles 90 of the VVM 100 include: aluminum, brass, carbon black, copper, graphite, gold, iron, nickel, silver, stainless steel, tin, zinc and alloys thereof as well as other metal alloys. In addition, intrinsically conducting polymer powders, such as polypyrrole or polyaniline may also be employed, as long as they exhibit stable electrical properties.

In an embodiment, the conductive particles 90 include nickel manufactured by Atlantic Equipment Engineering and marketed under the tradename Ni-120, which have an average particle size in the range of 10–30 microns. In another embodiment, the conductive particles 90 include aluminum and have an average particle size in the range of 1 to 30 microns.

Figure 3:
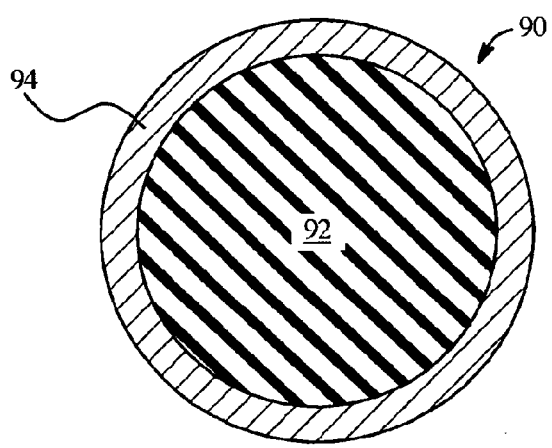
FIG. 3 is a sectional schematic illustration of a core and shell type conductive particle of the VVM of the present invention.

Referring to FIG. 3, in one embodiment, the conductive particles include an inner core 92 surrounded by an outer shell 94. The core 92 and the shell 94 of the particles 90 have different electrical conductivities. In an embodiment, the core and the shell particles 90 are substantially spherical in shape and range from about 25 to about 50 microns.

In one embodiment, the inner core 92 of the conductive particles 90 includes an electrically insulating material, wherein the outer shell 94 includes one of the following materials: (i) a conductor; (ii) a doped semiconductor; or (iii) a semiconductor. In another embodiment, the inner core 92 of the conductive particles 90 includes a semiconductive material, wherein the outer shell 94 includes one of the following materials: (i) a conductor; (ii) a doped semiconductor; or (iii) a semiconductive material other than the semiconductive material of the inner core. In a further embodiment, the inner core 92 includes a conductive material, wherein the outer shell 94 may be comprised of one of the following materials: (i) an insulating material; (ii) a semiconductor; (iii) a doped semiconductor; or (iv) a conductive material other than the conductive material of the inner core.

Conductive materials suitable for use in the conductive core-shell particles 90 include the following metals and alloys thereof: aluminum, copper, gold, nickel, palladium, platinum, silver, titanium and zinc. Carbon black may also be used as a conductive material in the VVM 100. The insulating materials 60, semiconductive particles 70 and doped semiconductor particles 80 described above may be mixed with the conductive core-shell particles 90 in the binder 50 of the VVM 100 of present invention.

In one preferred embodiment, the core-shell particles 90 include an aluminum core 92 and an aluminum oxide shell 94. The particles 90 having the aluminum core 92 and the aluminum oxide shell 94 can then be provided in the intrinsically adhesive binder having formed silica without additional insulating particles 60, semiconductive particles 70 or doped semiconductive particles 80.

In another embodiment, the core-shell particles 90 include a titanium dioxide (insulator) core 92 and an antimony doped tin oxide (doped semiconductor) shell 94. These latter particles are marketed under the tradename Zelec 1410-T. Another suitable core-shell particle 90 is marketed under the tradename Zelec 1610-S and includes a hollow silica (insulator) core 92 and an antimony doped tin oxide (doped semiconductor) shell 94.

Particles having a fly ash (insulator) core 92 and a nickel (conductor) shell 94, and particles having a nickel (conductor) core 92 and silver (conductor) shell 94 are marketed by Novamet are also suitable for use in the present invention. Another suitable alternative is marketed under the tradename Vistamer Ti-9115 by Composite Particles, Inc. of Allentown, Pa. These conductive core-shell particles have an insulative shell 92 of ultra high-density polyethylene (UHDPE) and a conductive core 94 material of titanium carbide (TiC). Also, particles 90 having a carbon black (conductor) core 92 and a polyaniline (doped semiconductor) shell 94 marketed by Martek Corporation under the tradename Eeonyx F-40-10DG may be used in the VVM 100 of the present invention.

In one embodiment of the VVM 100, the intrinsically adhesive insulative binder 50 constitutes from about 20 to about 60%, and more specifically from about 25 to about 50%, by weight of the total composition. The conductive particles 90 in an embodiment constitute from about 5 to about 80%, and more specifically from about 50 to about 70%, by weight of the total composition. These ranges apply whether or not VVM 100 includes additional insulative particles 60, semiconductive particles 70 and/or doped semiconductive particles 80. The semiconductive particles 70, if present, constitute from about 2 to about 60%, and more specifically from about 2 to about 10%, by weight of the total composition.

In another embodiment of the VVM 100, the intrinsically adhesive insulative binder 50 constitutes from about 30 to about 65%, and more specifically from about 35 to about 50%, by volume of the total composition. The doped semiconductive particles 80 constitute from about 10 to about 60%, and more specifically from about 15 to about 50%, by volume of the total composition. The semiconductive particles 70 constitute from about 5 to about 45%, and more specifically from about 10 to about 40%, by volume of the total composition. The insulating particles 60 comprise from about 1 to about 15%, and more specifically from about 2 to about 10%, by volume of the total composition.

The switching characteristics of the VVM 100 are determined by the nature of the insulating, semiconductive, doped semiconductive and conductive particles, the particle sizes and size distribution, and the interparticle spacing. The interparticle spacing depends upon the percent loading of the insulating, semiconductive, doped semiconductive and conductive particles and on their size and size distribution. In the compositions of the present invention, interparticle spacing will be generally greater than 1,000 angstroms.

Through the use of the VVM 100 employing the intrinsically adhesive insulative binder 50 and the other particles described above, compositions of the present invention generally can be tailored to provide a range of clamping voltages from about 30 volts to greater than 2,000 volts. Certain embodiments of the present invention for circuit board level protection exhibit clamping voltages in a range of 100 to 200 volts, more specifically less than 100 volts, still more specifically less than 50 volts, and especially exhibit clamping voltages in a range of about 25 to about 50 volts.

The VVM 100 having the intrinsically adhesive insulative binder 50 may be self-cured or self-secured to conductive and insulative materials. The insulative binder 50 adheres and cures to any type of electrical lead, coil, electrode, pin, trace, etc. The insulative binder 50 adheres and cures to any type of insulative material, laminate or substrate. For example, the insulative binder 50 adheres and cures to any type of printed circuit board material, flexible circuit material, polymer, glass and ceramic.

In one embodiment, the insulative binder 50 of the VVM 100 adheres and cures to a known FR-4 laminate. The FR-4 laminate typically includes a woven or non-woven fabric, which is meshed or perforated. The binder 50 of the VVM 100 may also adhere to a FR-4 layer of a multi-layer PCB. In another embodiment, the insulative binder 50 of the VVM 100 adheres and cures to a polyimide material. One type of polyimide material to which the insulative binder 50 intrinsically secures is manufactured by Dupont Corporation and is called "Kapton". There are three variants of the Kapton® material. One Kapton® material includes an acrylic base adhesive but is not flame retardant. Another Kapton® material includes an acrylic base adhesive and is flame retardant. A third Kapton® material is adhesiveless. The insulative binder 50 of the VVM 100 can adhere and cure to each of the variants.

The insulative binder 50 of the VVM 100 can further adhere to a rigid-flexible material. As its name implies, the rigid-flexible material is a composite of two different materials, one flexible (such as Pyralux), and the other rigid (FR-4). This type of material is especially useful for any application that requires connection to moving or bending parts and also requires a stable platform for components.

Figure 4:
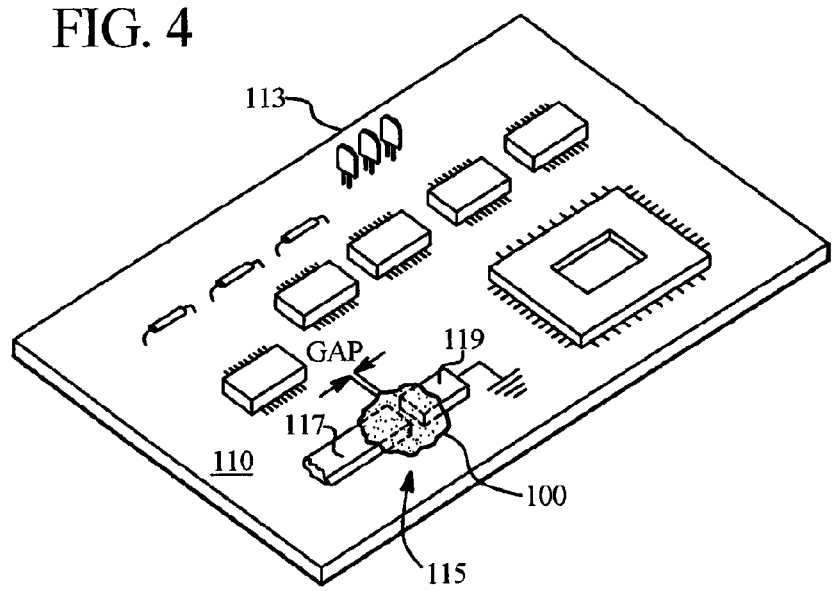
FIG. 4 is a perspective view of a rigid printed circuit board ("PCB") substrate that illustrates one circuit arrangement for the intrinsically adhesive VVM of the present invention.

Referring now to FIG. 4, one possible arrangement 115 for the intrinsically adhesive VVM 100 is illustrated. The arrangement 115 appears in this example on substrate 110, which is a rigid PCB. A number of other electrical devices 113 are illustrated, which shows that the VVM 100 is open and exposed when the PCB substrate 110 is in a finished form. The electrical devices 113 include any type of electrical device commonly connected to a PCB including both through-hole and surface-mounted devices. The electrical devices 113 include any electrical components, such as a resistor or capacitor. The electrical devices 113 also include any type of integrated circuit, connector, filter, etc.

The arrangement 115 resides next to the other electrical components 113 on the PCB substrate 110. The arrangement 115 is illustrated having two electrodes 117 and 119 that are each secured to the PCB substrate 110 via any method known to those of skill in the art. Although two electrodes 117 and 119 are illustrated, the arrangement 115 can have any number of electrodes. In the arrangement 115, the quantity of VVM 100 intrinsically adheres to the electrodes 117 and 119 and to the substrate 110. A gap exists between the electrodes 117 and 119, which is shown in phantom in this perspective view because it is covered by the quantity of VVM 100. The gap width in an embodiment is around 2 mils, however, larger or narrower gap widths may be used. The electrodes 117 and 119 normally do not electrically communicate with one another. Upon an EOS transient event, the VVM 100 switches from a high impedance state to a low impedance state, wherein a transient spike shunts, here, from the electrode 117 through the VVM 100 to the electrode 119, which is connected to a shield ground or earth ground as illustrated.

For convenience, the electrode 117 is illustrated terminating with a fragmented end. It should be appreciated that the electrode 117 can lead to any type of electrical device. In an embodiment, electrode 117 is a trace on the PCB that carries a signal, e.g., from a telecommunications transmission. In this case, the electrode 117 may lead to a connector that receives a telecom input line or to some type of transceiver.

Figure 5:
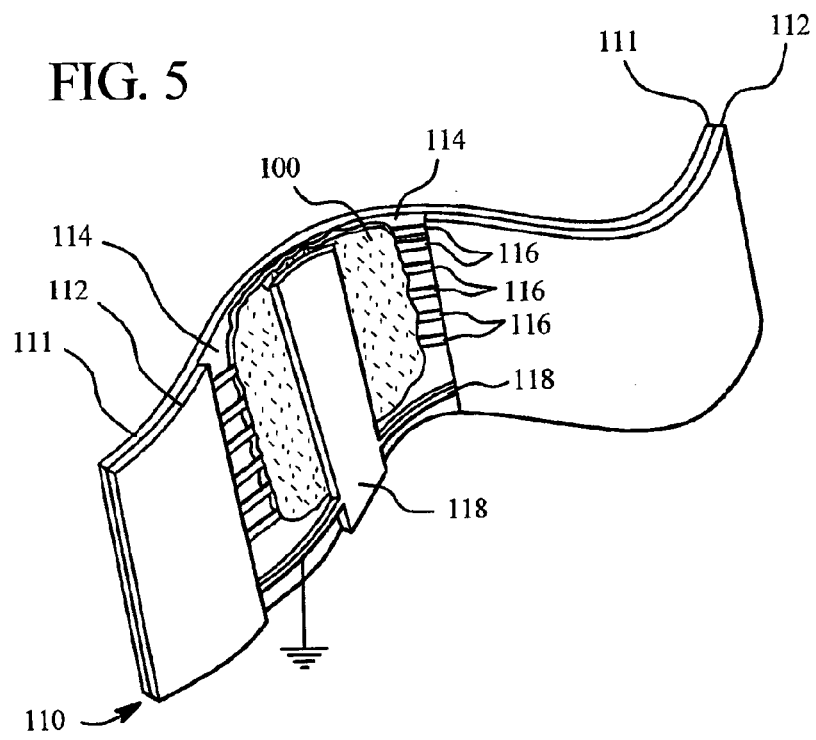
FIG. 5 is a perspective view of a flexible substrate having the intrinsically adhesive VVM of the present invention.

Referring now to FIG. 5, a "Z" direction arrangement is illustrated on a substrate 110, which in an embodiment is a multi-layered flexible ribbon or circuit. The flexible substrate 110 includes a plurality of flexible layers 111 and 112. As described above, the flexible substrate 110 may include layers 111 and 112 that are made of a polyimide. For example, the layers 111 and 112 may be a Kapton® material. In another embodiment, one or both of the layers 111 and 112 are mylar layers. A section of the layer 112 of the substrate 110 is cut away so as to illustrate a number of signal conductors 116 as well as a ground conductor 118. With the conductors 116 and the ground conductor 118 exposed, the self-adhesive VVM 100 having the self-curable binder 50 can be applied across each of the conductors 116.

As illustrated, each of the conductors 116 and the ground conductor 118 is separated by a gap, so that the conductors do not normally electrically communicate with one another. In an embodiment, the ground conductor (only a portion shown for convenience) 118 lays on top of the VVM 100. The gap is therefore said to be in the "Z" direction, wherein the gaps between the conductors 116 reside in an X-Y plane. The thickness of the VVM layer is less than the spacing between signal conductors 116. An EOS transient will therefore jump from one of the conductors 116 to ground 118 instead of to another conductor 116. In another embodiment, a separate ground trace 118 can be placed next to each signal trace, so that the transient will jump from a signal trace 116 to a ground trace 118. Either way, the layer of VVM 100 enables any of the signal conductors 116 that experiences an overvoltage to shunt same to a ground conductor 118.

As in the rigid PCB application of FIG. 4, the conductors or electrodes 116 (and 118) secure to a surface of a substrate. Here, conductors 116 secure to an inner surface 114 of the flexible layer 111 via any method known to those of skill in the art. In the "Z" direction embodiment, the ground conductor sticks to the top of the layer of VVM 100. The conductors 116 and ground conductor 118 are also compressed and held in place by the multiple layers 111 and 112. However, it is possible that the VVM 100 is exposed on the outside of one of the flexible layers 111 and 112. The quantity of VVM 100 covers each of the conductors 116 as illustrated and also intrinsically adheres to the inner surface 114 of the layer 111. The layer of VVM 100 self-cures to the plurality of conductors 116 and the inner surface 114 of the layer 111 without the need for an additional curing or heating step. In an alternative embodiment, however, the layer of VVM 100 may be more quickly cured by heating the flexible circuit for a predetermined amount of time.

The binder 50 as described above cures in such a manner that the quantity of VVM 100 does not crack or split even when the flexible substrate 110 is bent or moved. Even so, the exposed area of inner surface 114 and the ground plane 118 in a preferred embodiment are covered for purposes of electrical insulation. In an embodiment, the VVM 100 and the conductors 116 and ground conductor 118 are covered by a silver ink coating. The VVM in an embodiment can cover an entire surface of the traces 116 and ground trace 118 to enhance the dissipation ability of the VVM 100. In a further alternative embodiment, an intermediate insulative coating, such as a dry film photo-imagable cover lay, a spray liquid photo-imagable cover lay or a "glob-top" coating, can be disposed between the signal traces 116 and the inner surface of outer insulating (e.g., plastic) layer 112.

Figure 6:
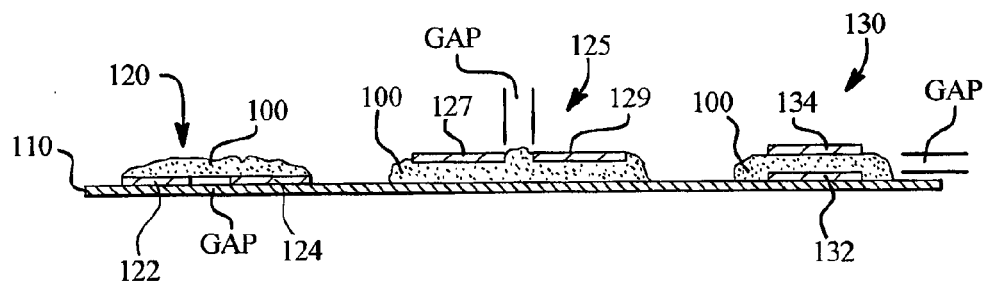
FIG. 6 is a sectioned elevation view illustrating three additional circuit arrangements for the intrinsically adhesive VVM of the present invention.

Referring now to FIG. 6, three alternative applications 120, 125 and 130 for the VVM 100 are illustrated. Each of the applications 120, 125 and 130 is illustrated in a simplified form having only two conductors. It should be appreciated however, that any of the applications disclosed herein can electrically connect and protect a multitude of conductors, such as in FIG. 5. It should also be assumed, although not illustrated, that one of the conductors is a ground or shield conductor, or another type of conductor with a low impedance path to ground, while at least one other conductor is a signal or line conductor, wherein the VVM 100 shunts an overvoltage transient from the line or signal conductor to the ground or shield conductor. Further, applications 120, 125 and 130 are illustrated in a finished form, wherein VVM 100 is open and exposed to the environment.

The arrangement 120 illustrates a circuit having conductors 122 and 124 that are spaced apart by a gap. Each of the conductors 122 and 124 is secured to the substrate 110 via any method known to those of skill in the art. The substrate 110 can be any of the substrates described above such as a rigid PCB substrate or a flexible circuit type of substrate. The application or circuit 120 differs from the circuit 115 in that the VVM 100 does not adhere to the substrate 110. To form such a circuit, it may be necessary to support the VVM 100 above the gap until the VVM 100 cures and dries in place. In another embodiment, a top layer or coating may also adhere to the VVM 100 wherein the coating enables the VVM 100 in a semi-cured state to be placed on the conductors 122 and 124. Importantly, the VVM 100 does not need to adhere to the substrate 110 in the gap area in order for the VVM 100 to function properly. The circuit 120 functions exactly the same way as the circuit 115 illustrated in FIG. 4, with regard to the shunting capabilities of the VVM 100.

The circuit or arrangement 125 illustrates that the VVM 100 can intrinsically secure to the substrate 110 and thereby form a buffer or bed onto which conductors 127 and 129 are placed. The electrodes 127 and 129 are separated by a gap. The electrodes may sink slightly into the VVM 100 as illustrated or the electrodes 127 and 129 may be placed onto the VVM 100 when the VVM has cured to the point that it does not deform due to the weight of the conductors or due to the application process. The circuit or arrangement 125 operates the same as the circuits 115 and 120.

The circuit or arrangement 130 illustrates an embodiment where one of the conductors, namely, the conductor 132 secures to the substrate 110, while a second conductor 134 is suspended on top of the layer of VVM 100, similar to the electrodes 127 and 129 of the arrangement 125. The gap in the circuit 130 is a vertically disposed gap. The gaps in the arrangements 115, 120 and 125 are horizontally disposed. It should be appreciated that the VVM 100 operates equally as well whether the gap is an "XY" direction type of gap, such as with the arrangements 115, 120 and 125, or whether the gap is a "Z" direction type of gap as illustrated in the arrangement 130.

Each of the arrangements of FIG. 6 may be desirable in certain electrical configurations and with certain electrical components. The VVM 100 having the insulative binder 50 of the present invention provides the flexibility to arrange electrodes in different ways with respect to the substrate 110, wherein the VVM 100 does not require an extra apparatus or housing to mechanically hold the VVM or to electrically connect it to the conductors. For example, many VVM devices require a housing or shell that holds the VVM in place. Many VVM's also include a pair of terminals disposed on the housing or shell that must be soldered to a pair of pads formed on the surface of the substrate. From the pads, additional traces or bond wires are required to extend to connecting signal lines or ground line.

Figure 7:
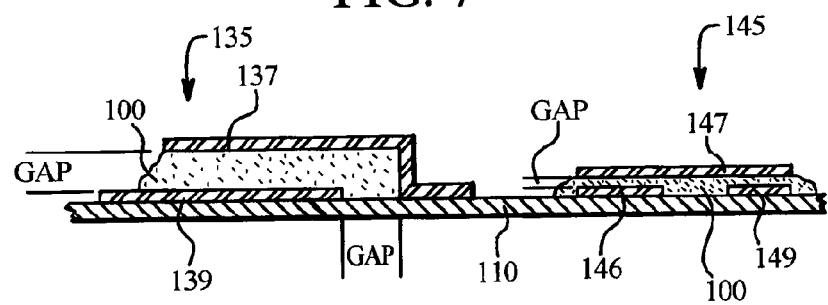
FIG. 7 is a sectioned elevation view illustrating two "Z" direction type circuit arrangements for the intrinsically adhesive VVM of the present invention.

Referring now to FIG. 7, additional circuits or arrangements 135 and 145 are illustrated. The arrangement 135 is similar to the arrangement 130 in that there is a "Z" direction gap between an upper electrode 137 and a lower electrode 139, wherein the lower electrode 139 is secured to the substrate 110. In the arrangement 135, however, the upper electrode 137 extends laterally or horizontally away from the lower electrode 139 and turns downwardly to attach to the substrate 110. The horizontal offset creates a second gap. When an overvoltage occurs, the transient spike may conduct through VVM 100 either in the "Z" direction or in an "XY" direction, depending on which path has the lower impedance. The arrangement 135 otherwise operates the same as the other arrangements.

The arrangement 145 is similar to the flex circuit embodiment of FIG. 5, except the conductors 146 and 149 are disposed on rigid substrate 110. In one embodiment, the floating conductor 147 is the ground conductor, making the arrangement a purely "Z" direction application. In another embodiment, either of the conductors 146 and 149 is the ground conductor making the application a "Z" direction and an "XY" direction application, wherein the voltage can discharge from one of the conductors 146 or 149, to the floating conductor 147, and down to the other conductor, which is the ground conductor.

Figure 8:
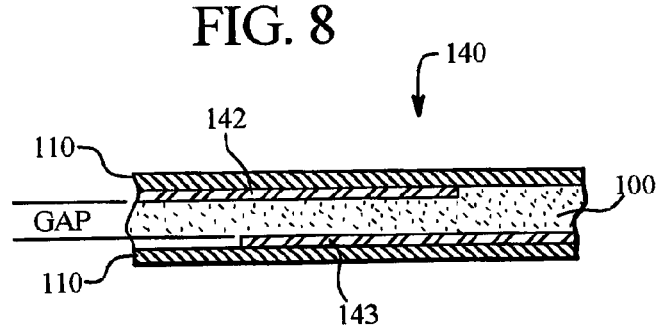
FIG. 8 is a sectioned elevation view illustrating still a further circuit arrangement for the intrinsically adhesive VVM of the present invention.

Referring now to FIG. 8, a further alternative arrangement or circuit 140 is illustrated. The circuit 140 includes two substrates 110, which may be rigid substrates such as FR-4 boards, or a flexible substrates, such as a polyimide or Kapton® material. A first electrode 142 is secured to the upper substrate 110, while a second electrode 143 secures to the lower substrate 110. The electrodes 142 and 143 are spaced apart in the "Z" direction by a quantity of VVM 100. The arrangement 140 is useful, for example, in a flexible circuit, wherein the substrates 110 are outer layers of Kapton® or mylar, and wherein the upper conductor 142, for example, is a signal conductor and the lower conductor 143 is a ground conductor. Here, a multitude of signal conductors can be applied to either the upper or lower substrates 110, wherein a transient spike travels vertically or horizontally depending upon where the signal trace having the transient spike is located with respect to a ground conductor.

Referring now to FIG. 9, the previous arrangements or circuits 115, 120, 125, 130, 135 and 145 are illustrated as being imbedded inside a multilayer PCB. That is, the substrate 110 constitutes one layer of a PCB. A second substrate 144 (not to scale) constitutes another layer of the multilayer PCB. The layer 144 is formed around the various circuits so as to produce a smooth outer surface that is suitable for mounting electrical components 113 and circuit board traces. The configuration of FIG. 9 is particularly useful in that the outer surfaces of the substrates 110 and 144 are not inhibited whatsoever by the circuit protection. The embodiment illustrated in FIG. 9 can include more than two layers, and thus the embodiment can include a multitude of different substrates having one or more of the arrangements 115, 120, 125, 130, 135 and 145.

Referring now to FIG. 10, a similar arrangement is illustrated having the circuits 115, 120, 125, 130, 135, and 145, wherein instead of the arrangements being part of a multilayer PCB, the arrangements are covered by a protective coating 148. Even though the VVM 100 self-secures to various electrodes and to the substrate 110 in certain places, it may also be desirable for a number of reasons to apply a protective coating 148. For example, as with the flexible circuit illustrated in FIG. 5, the conductors may be exposed at certain points and require electrical insulation. The protective coating 148 can be any type of coating known to those of skill in the art. In an embodiment, the coating includes any of the coatings described above for the flexible circuit in FIG. 5, such as a silver ink, a dry film photo-imagable cover lay, a spray liquid photo-imagable cover lay or a "glob-top" coating.

Figure 11:
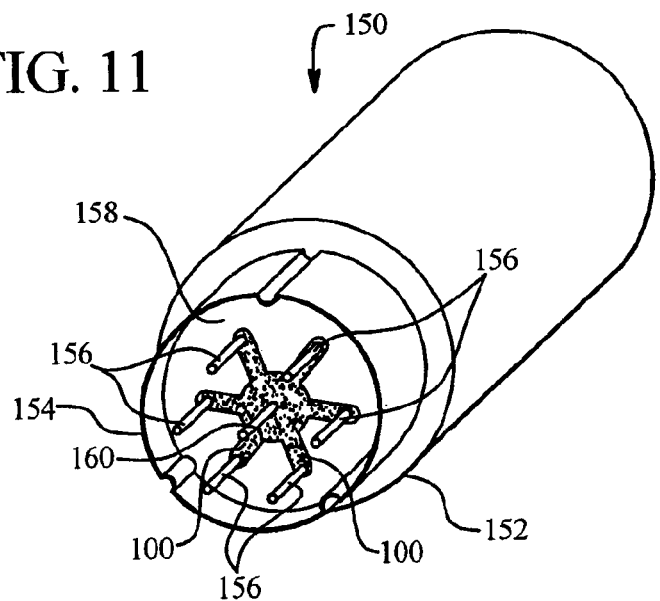
FIG. 11 is a perspective view of one embodiment of a DIN connector having the directly applied VVM of the present invention.

Referring now to FIG. 11, the VVM 100 of the present invention may be employed in a device. One type of device illustrated in FIG. 11 includes a variety of connectors that comply with the Deutsches Institut für Normung eV ("DIN") standards. A circular DIN connector 150 is illustrated. It should be appreciated that the present invention may be adapted for miniature DIN connectors, double row elongated DIN connectors, shielded DIN connectors, etc. The present invention may be implemented in a plug or receptacle. Vertical, horizontal and in-line connectors that attach to a cable may also be employed. Otherwise, the DIN connector may be panel mounted.

The connector 150 includes a body 152 that is constructed of any suitable material. The body, in both plug and receptacle implementations, secures a circular wall 154 or a plurality of straight walls (not illustrated) that at least partially encompass a plurality of signal conductors 156. The conductors 156 extend from a substrate 158 in a direction that is substantially parallel with the wall 154. The wall 154 and conductors 156 plug into a mating female DIN connector as is well known.

In the illustrated embodiment, the body 152 is a plug and the conductors 156 are pins. In an alternative embodiment (not illustrated), the body is a receptacle, and the signal conductors are sockets that receive pins from a mating connector. The connector 150 may be configured so that the body 152 secures any number of input/output conductors 156. One or more of the outer signal conductors 156 may be a ground conductor. Normally, however, a separate (here central) ground or shield ground conductor 160 is provided. In order for the illustrated embodiment to properly shunt a transient voltage spike to the ground conductor 160, the spacing between the input/output conductors 156 and the ground conductor 160 should be less than the spacing between the input/output conductors 156.

In one embodiment, the substrate 158 is a PCB, such as an FR-4 board. In another embodiment, the substrate 158 includes another type of insulative material, such as a polyimide or plastic. The substrate 158 fits inside the body 152 so that the connector 150 may be properly placed into a mating connector. In an embodiment, substrate 158 defines apertures that enable the conductors 156 to extend through from a back side of substrate 158 to the illustrated front side.

At least one quantity of VVM 100 is directly adhered or cured to the substrate 158. As illustrated, the VVM 100 of the present invention directly connects the signal conductors 156 to the ground conductor 160 without the need for traces or bond wires. In another embodiment, one or more conductors 156 or further alternatively the ground conductor 160 may contact an individual quantity of VVM 100, wherein one or more traces or bond wires individually secure the VVM 100 to another VVM quantity or to another conductor. The traces in an embodiment are copper that is etched onto the PCB substrate 158 as is well known. The signal traces can communicate with either or both the single signal conductors 156 and/or the ground conductor 160.

The ground conductor 160 may take several forms and is illustrated here as a centrally located pin 160. In each configuration, the adhesive binder 50 enables the VVM 100 to adhere directly to the metal conductors. The ground conductor 160 may act as either a circuit ground or a shield ground, as desired.

As illustrated, at least one quantity of VVM 100 protects one or more signal conductors 156 from a transient voltage spike. The protected connector 150 in turn can protect other electrical devices that are either electrically upstream or downstream from the connector 150.

Figure 12:
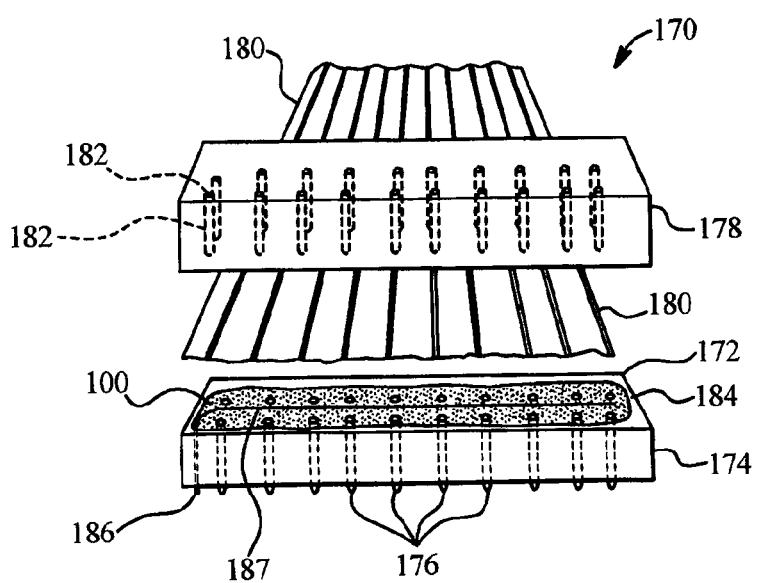
FIG. 12 is a perspective view of one embodiment of a ribbon cable connector having the directly applied VVM of the present invention.

Referring now to FIG. 12, the VVM 100 having the integrally adhesive binder 50 is used with a ribbon cable connector 170. The VVM 100 can be used with any type of ribbon cable connector, such as a male, female, straight lead, right angle, straight lead/wire wrap and right angle/wire wrap version of a socket connector, D-connector, PCB connector, card edge connector, dip connector, pin connector or termination jumper. The VVM 100 may be implemented in a plug or receptacle type of ribbon connector 170.

The ribbon connector 170 includes a body 172 that is constructed of any suitable material and in an embodiment is plastic. The body 172, in both plug and receptacle implementations, at least partially encompasses a plurality of conductors 176. The conductors 176 are substantially parallel with the walls of the body 172. If the body 172 is a plug, the conductors 176 are pins. If the body 172 is a receptacle, the conductors 176 are sockets that receive pins. The ribbon connector 170 may secure any number of input/output signal conductors 176. One or more of the conductors 176 may be a ground conductor. Normally, a separate circuit ground or shield ground 186 is provided. A ground strip 187 connects to the ground pin 186 and provides the proper spacing so that a voltage transient dissipates from one of the signal conductors 176 to the ground strip 187 rather than to another signal conductor 176.

Between the body 172 and a second mating body 178 lies a ribbon cable 180. Ribbon cable 180 may be any suitable cable including a gray flat cable, color coded flat cable, twisted pair flat cable and round jacketed/shielded flat cable. In the illustrated embodiment, the second body 178 is a plug that fits over the receptacle body 172. Pins 182 housed inside the plug body 178 pierce the insulation of the cable 180 and create electrical contact with conductors inside the cable.

In the illustrated embodiment, at least one and possibly a plurality of quantities of VVM 100 directly secure to the receptacle body 172 and the conductors 176 via the intrinsically adhesive property of the binder 50. The receptacle body 172 includes a substrate 184, which can be a polymer, a PCB material such as FR-4 or a polyimide. The VVM 100 can be applied to either the top or bottom surfaces of the substrate 184. In an alternative embodiment, traces are applied to the substrate 184 through any suitable method. The traces electrically connect the signal conductors 176 to the VVM 100, the VVM 100 to the ground conductor 186, or both.

As illustrated, at least one quantity of VVM 100 protects one or more signal conductors 176 of the ribbon cable connector 170 from a transient spike That is, the signal conductors 176 can shunt an overvoltage to the ground pin 186. The ribbon connector 170 can in turn protect electrical devices that are either electrically upstream or downstream from the connector 170.

Figure 13:
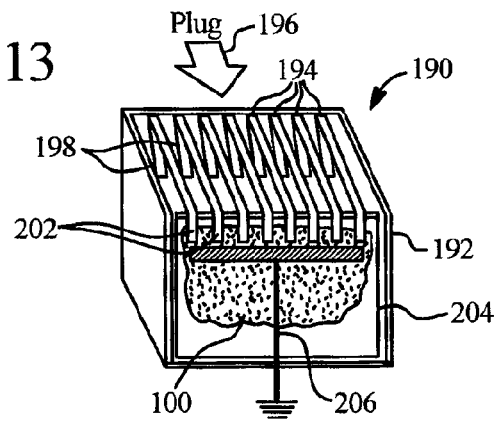
FIG. 13 is a cutaway perspective view of one embodiment of a data/telecommunications RJ type connector having the directly applied VVM of the present invention.

Referring now to FIG. 13, the VVM 100 having the intrinsically adhesive binder 50 is used with a data or telecommunications connector 190. The VVM 100 can be used with any type of data/telecom connector. In an embodiment, connector 190 is an eight conductor RJ-45 connector commonly used in data networks, such as local area networks ("LAN's"), wide area networks ("WAN's") and the like. In another embodiment, connector 190 is six conductor RJ-11 connector, commonly used in residential and in certain commercial telephone systems.

The connector 190 includes a body 192, much of which has been cut away in FIG. 13 to show the circuit protection provided by the VVM 100. The body 192 is constructed of any suitable material and in an embodiment is plastic. The body secures a number of signal conductors 194. The signal conductors 194 are bent appropriately to engage mating signal conductors of a plug (not illustrated). The plug is inserted into the data/telecom body 192 in the direction of arrow 196. When the plug inserts into the body 192, spring portions 198 of the signal conductors 194 bend so that a spring force is applied to the electrical connection between mating conductors.

In the illustrated embodiment, opposing ends 202 of the conductors 194 electrically communicate directly with one or more quantities of VVM 100, which is directly applied to substrate 204 via the intrinsically adhesive binder 50. VVM 100 directly electrically couples the signal conductors 194 to a ground conductor 206. As above, the ground conductor 206 is properly positioned, spaced closer to each of the signal conductors 194 than the signal conductors 194 are to each other. In another embodiment, the ends 202 of the conductors 194 electrically connect with traces to which the VVM 100 adheres. In a further embodiment, the VVM 100 electrically connects to the ends 202 of the signal conductors 194 via wire bonds.

Similarly, the VVM 100 in an embodiment, directly adheres to the ground conductor 206. In another embodiment, the ground conductor 206 electrically communicates with the VVM 100 via one or more traces secured to the substrate 204. In a further embodiment, the VVM 100 electrically communicates with the ground conductor 206 via a bond wire.

In the above described manner, one or more or all of the signal conductors 194 may be protected from a transient voltage. Because LAN's or WAN's typically encompass large distances between grounding points, ESD and EOS transients between the grounding points are serious problems. Devices such as air conditioners, heaters, elevators, copiers and laser printers, etc., can cause high levels of spikes and transients in buildings having LAN's. The protected data/telecom connector 190 protects devices connected to a network through the connector 190 from transient voltages occurring over the data lines of the network. Likewise, the connector 190 protects the data lines from an overvoltage event emanating from a device connected to the network.

Figure 14:
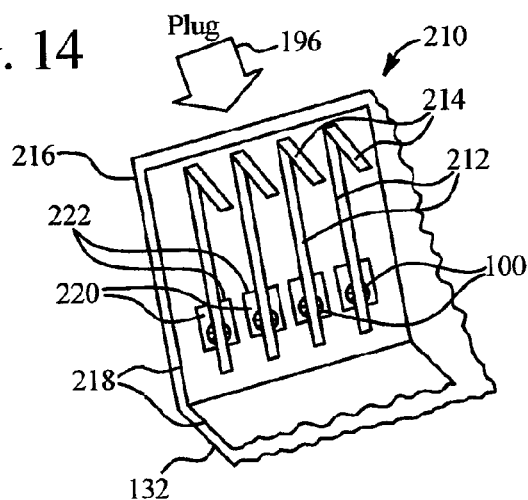
FIG. 14 is a cutaway perspective view of a number of signal conductors and a shield of one embodiment of a data/telecommunications RJ type connector having the directly applied VVM of the present invention.
Figure 15:
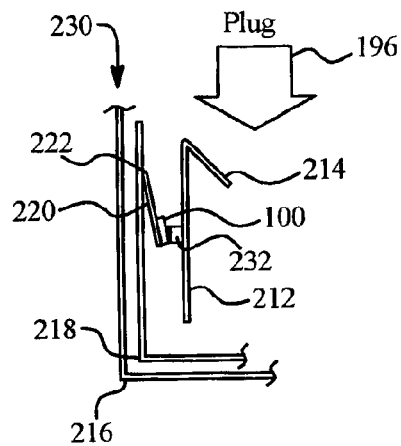
FIG. 15 is a side elevation view of a signal conductor, a shield and a capacitor of one embodiment of a data/telecommunications RJ type connector having the directly applied VVM of the present invention.

Referring now to FIGS. 14 and 15, other embodiments of the VVM 100 applied to telecommunications connectors are illustrated. The configurations illustrated in FIGS. 14 and 15 represent any type of data/telecom connector. In FIG. 14, only the relevant portion of the connector 210 is illustrated. The connector 210 includes a plurality of signal conductors 212 with the bent ends 214, wherein the bent ends 214 mate with conductors or a data/telecom plug (not illustrated) as described above. The plug travels in the direction of the arrow 196, which inserts into the connector 210.

A body 216, cutaway for purposes of illustration, houses a shield 218, which is constructed of any suitable conductive material. The view of FIG. 14 is generally from underneath the connector as it is illustrated in FIG. 13. The shield 218 therefore fits on top of and in back of the conductors 212.

The shield defines one or more cutout spring tabs 220. That is, the thin metal shield 218 is stamped or cut along three sides of each tab 220, wherein the tab 220 is bent inward along the edge 222. The tabs 220 may be bent inward to any desired angle less that 90°. When the shield 218 is placed over the conductors 212, the tabs 220 contact the conductors 212 and bend back towards 0°. The tabs 220 are therefore biased to maintain electrical contact with the conductors 212.

A quantity of VVM 100, having the self-curing intrinsically adhesive binder 50 is directly applied to the tabs 220, between the tabs 220 and the conductors 212. The VVM 100 acts as an open circuit in its high impedance state, so that little current normally flows from the conductors 212 to ground 218. When an ESD transient occurs, the VVM 100 switches to its low impedance state, so that the transient spike shunts to the shield ground 218.

In an embodiment, a stencil is used to apply a plurality of quantities of VVM 100 to a plurality of tabs 220. In another embodiment, a stencil is used to apply a plurality of quantities of VVM 100 to a single tab 220 that spring-loads and causes contact to occur with a plurality of conductors 212. In a further embodiment, a layer of the VVM 100 material is first self-adhered to a large area of the shield 218, wherein a plurality of tabs 220 are then stamped so that each has an individual quantity of VVM 100. In yet another embodiment, a layer of the VVM 100 is first self-adhered to a large area of the shield 218, wherein one or more tabs 220 that each contact a plurality of conductors 212 is stamped.

Referring to FIG. 15, which is a side view of FIG. 14, a variation of the connector 210 of FIG. 14 is illustrated as a new connector 230. As before, the body 216 is cutaway to reveal a portion of the shield 218. The shield 218 has been stamped so that the tab 220 bends inward along the edge 222 between the shield 218 and the conductor 212. The tab includes a quantity of VVM 100 having the self-adhesive binder 50 of the present invention.

The signal conductor 212 has the bent spring portion 214 that is adapted to mate with a conductor of a plug (not illustrated), wherein the plug inserts into the connector 230 in the direction indicated by the arrow 196. In one embodiment, a coupling capacitor 232 is disposed between the VVM 100 on the tab 220 and the signal conductor 212. Tab 220, VVM 100, capacitor 232 and signal conductor 212 are connected in series in one preferred embodiment. The capacitor 232 has a capacitance and voltage rating appropriate to handle a DC voltage of 2500 volts. That is, the coupling capacitor 232 is designed to block out high levels of DC voltage, such as those imposed during high potential [HI-POT] testing, to which LAN or Ethernet systems may become exposed.

The VVM 100 also adheres to and makes electrical contact with the capacitor 232. The capacitor 232 may also be soldered or otherwise electrically connected to the conductor 212. The spring loading of the tab 220 also holds the capacitor 232 in place. The order of the capacitor 232 and the VVM 100 may be reversed. It should also be appreciated that in FIGS. 14 and 15, the stamped tabs 200 may be used alternatively with a VVM device (not illustrated) that uses any VVM known to those of skill in the art.

FIGS. 11 through 15 illustrate that the VVM 100, through the binder 50, can be applied directly to a substrate, wherein the substrate is used in a piece of electrical equipment, such as a connector. Besides the various connectors illustrated, it should be appreciated that the substrate can be placed in other types of connectors, such as digital video interfacing ("DVI") connectors, analog to digital converter ("ADC") connectors, etc., as well as other types of equipment, such as audio headsets, camcorders, televisions, radios, personal email devices, computers, etc.

It should be understood that various changes and modifications to the presently preferred embodiments described herein will be apparent to those skilled in the art. Such changes and modifications may be made without departing from the spirit and scope of the present invention and without diminishing its attendant advantages.

The invention is claimed as follows:

1. An overvoltage protection circuit comprising:
 a printed circuit board having a substrate surface;
 an electrical circuit formed on the substrate surface, the electrical circuit including:
  a plurality of electrode pairs formed along the electrical circuit;
  a gap formed between each of the plurality of electrode pairs; and
 a voltage variable layer including a self-curing adhesive binder configured to adhere to the substrate surface, the voltage variable layer applied to contact each of the plurality of electrode pairs across each corresponding gap;
 wherein the voltage variable layer is directly applied to the surface of the substrate by way of an ink that dries to its final form.

2. The circuit of claim 1, wherein the printed circuit board is a flexible circuit board.

3. The circuit of claim 1, wherein the printed circuit board includes at least two layers.

4. The circuit of claim 1, wherein the printed circuit board is manufactured from a material chosen from the group consisting of: rigid laminate, polyimide, polymer, glass, ceramic and any combination thereof.

5. The circuit of claim 1, wherein the printed circuit board is configured to cooperate with a piece of electrical equipment.

6. The circuit of claim 5, wherein the electrical equipment is a connector.

7. The circuit of claim 1, wherein the self-curing adhesive binder is an insulative binder that supports a material chosen from the group consisting of: conductive particles, insulating particles, semiconductive particles, doped semiconductive particles and any combination thereof.

8. The circuit of claim 7, wherein the conductive particles individually include an inner core and an outer shell.

9. A protection circuit comprising:
 a printed circuit board having a layered substrate;
 a plurality of electrical circuits having a plurality of electrodes pairs each separated by a gap, the plurality of electrical circuits disposed on the layered substrate; and
 a voltage variable layer having an adhesive binder, the voltage variable layer adhered adjacent to each of the gaps corresponding to each of the electrodes pairs and applied to contact each of the plurality of electrode pairs across each corresponding gap;
 wherein the voltage variable layer is directly applied to the layered substrate by way of an ink that dries to its final form.

10. The circuit of claim 9, wherein the printed circuit board is a flexible circuit board.

11. The circuit of claim 9, wherein the printed circuit board is manufactured from a material chosen from the group consisting of: rigid laminate, polyimide, polymer, glass, ceramic and any combination thereof.

12. The circuit of claim 9, wherein the printed circuit board is adapted to cooperate with a piece of electrical equipment.

13. The circuit of claim 12, wherein the piece of electrical equipment includes one of: a telecommunications device and an input/output connector.

14. The circuit of claim 9, wherein the adhesive binder is an insulative binder that provides the self-curing property and supports a material chosen from the group consisting of: conductive particles, insulating particles, semiconductive particles, doped semiconductive particles and any combination thereof.

15. The circuit of claim 14, wherein the conductive particles individually include an inner core and an outer shell.

16. A printed circuit board assembly comprising:
a circuit board substrate having a substrate surface;
an electrical circuit disposed on the substrate surface, wherein the electrical circuit includes:
a first electrode;
a second electrode; and
a gap separating the first electrode from the second electrode;
a voltage variable layer applied to the gap defined within the electrical circuit and configured to contact the first and second electrodes, the voltage variable layer including a polymeric self-curable insulative binder;
wherein the voltage variable layer is directly applied to the surface of the substrate by way of an ink that dries to its final form.

17. The assembly of claim 16, wherein the polymeric self-curable insulative binder is an adhesive binder.

18. The assembly of claim 16, further comprising a coating that covers the first and second electrodes.

19. The assembly of claim 16, wherein the circuit board substrate and the first and second electrodes form part of a multi-layered printed circuit board.

20. The assembly of claim 16, wherein the circuit board substrate is a flexible substrate.

21. The assembly of claim 16, wherein one of the first and second electrodes is a ground electrode.

22. A protection circuit comprising:
a circuit board substrate having a substrate surface;
a plurality of electrical circuits disposed on the substrate surface, each of the plurality of electrical circuits including: a first electrode; a second electrode; and a gap separating the first electrode from the second electrode;
a voltage variable layer including a polymeric adhesive binder that has been dissolved in a solvent and thickened with an agent, the voltage variable layer applied directly to the substrate surface as an ink that dries to its final form and contacts the first and second electrodes.

23. The assembly of claim 22, wherein the polymeric adhesive binder is self-curable.

24. The assembly of claim 22, wherein the solvent includes carbitol acetate.

25. The assembly of claim 22, wherein the agent includes a fumed silica.

26. The assembly of claim 22, wherein the voltage variable layer includes conductive particles having an aluminum core and an aluminum oxide shell.

* * * * *